United States Patent [19]
Saga

[11] Patent Number: 6,044,874
[45] Date of Patent: Apr. 4, 2000

[54] SEALED CONTAINER AND SEALED CONTAINER AMBIENT GAS SUBSTITUTION APPARATUS AND METHOD

[75] Inventor: Koichiro Saga, Kanagawa, Japan

[73] Assignee: Sony Corporation, Tokyo, Japan

[21] Appl. No.: 09/080,919

[22] Filed: May 19, 1998

[30] Foreign Application Priority Data

May 20, 1997 [JP] Japan .................................... 9-145922

[51] Int. Cl.[7] ...................................................... B65B 31/00
[52] U.S. Cl. ............................... 141/63; 141/48; 141/93; 141/98; 414/217; 414/940
[58] Field of Search .................. 141/48, 63, 93, 141/98; 414/217, 292, 935, 940; 206/710, 711, 712

[56] References Cited

U.S. PATENT DOCUMENTS

| | | | |
|---|---|---|---|
| 5,169,272 | 12/1992 | Bonora et al. | 414/217 |
| 5,575,081 | 11/1996 | Ludwig | 34/218 |
| 5,752,796 | 5/1998 | Muka | 414/217 |

Primary Examiner—Steven O. Douglas
Assistant Examiner—Peter deVore
Attorney, Agent, or Firm—Hill & Simpson

[57] ABSTRACT

First and second wall portions respectively spread along first and second opposing inner surfaces of a housing portion, and a plurality of vent pores that are distributed along the first and second inner surfaces are formed in the first and second wall portions. Hence, when an ambient gas is supplied to a space between the first inner surface and the first wall portion and another ambient gas is simultaneously discharged from a space between the second inner surface and the second wall surface, a laminar flow of an ambient gas directed from the first inner surface toward the second inner surface is formed to be parallel to a plate-like body held by a base portion.

2 Claims, 4 Drawing Sheets

SEALED CONTAINER AND SEALED CONTAINER AMBIENT GAS SUBSTITUTION APPARATUS AND METHOD

BACKGROUND OF THE INVENTION

1. Field of the Invention

The present invention relates to a sealed container and a sealed container ambient gas substitution apparatus and method for substituting the ambient gas in the sealed container.

2. Description of the Related Art

Electronic substrates, e.g., semiconductor devices, liquid crystal devices and magnetic disks, are manufactured in a clean room free from dust, and are conveyed from one step to another in the clean room while a cassette accommodating the electronic substrates is accommodated in a portable sealed container, in order to prevent contamination that occurs when molecules of organic substances, boron or phosphorus are adsorbed by the electronic substrates.

In recent years, in order to prevent not only contamination that occurs when the molecules of organic substances or the like are adsorbed by the electronic substrate, but also growth of the native oxide on the surfaces of the electronic substrates, the cassette is accommodated in a portable sealed container, the internal ambient gas of which is substituted with an inert gas, e.g., nitrogen or argon, to decrease the oxygen concentration, and the electronic substrates are conveyed in this state.

FIG. 1 shows a semiconductor wafer portable sealed container which is used in the semiconductor device manufacturing process, a semiconductor wafer cleaning unit and a portable sealed container ambient gas substitution unit mounted on the cleaning unit. In a portable sealed container 11, a cassette 13 accommodating semiconductor wafers 12 is placed on a bottom plate 14, and the bottom plate 14 and a housing 15 are fitted with each other to form a sealed space.

An opening 17 is formed in the upper surface of an ambient gas substitution apparatus 16, and the peripheral portion of the opening 17 forms a work table 18 for the portable sealed container 11. When the portable sealed container 11 is placed on the work table 18, the bottom plate 14 and the cassette 13 are moved downward by an elevator 19 while leaving only the housing 15 on the opening 17. The semiconductor wafers 12 are extracted from the cassette 13 one by one, and are conveyed into a cleaning unit 21.

A cleaning cup 22 is arranged in the cleaning unit 21, and a cleaning chuck 23 and a cleaning nozzle 24 are arranged in the cleaning cup 22. A semiconductor wafer 12 cleaned by the cleaning unit 21 is conveyed in the sealed space to be returned to the cassette 13 in the ambient gas substitution apparatus 16. Then, the bottom plate 14 and the cassette 13 are moved upward by the elevator 19.

Immediately before the bottom plate 14 closes the opening 17 to form a sealed space together with the housing 15, the elevator 19 is stopped once, and the ambient gas substitution apparatus 16 substitutes the ambient gas in the portable sealed container 11 with nitrogen. When the oxygen concentration in the portable sealed container 11 reaches a predetermined value, e.g., 10 ppm, the elevator 19 is moved upward again and the bottom plate 14 and the housing 15 are fitted to each other to form a sealed space.

Thereafter, the portable sealed container 11 is removed from the ambient gas substitution apparatus 16, and is conveyed to a next-step unit, e.g., an oxidation unit or film formation unit. The semiconductor wafers 12 are processed in the sealed space in this step as well. Between the respective steps, the semiconductor wafers 12 are conveyed as they are accommodated in the portable sealed container 11, the ambient gas of which has been substituted with clean nitrogen which is purified by filtration.

FIG. 2 shows a portable sealed container 11 according to one related art and the main part of an ambient gas substitution apparatus 16 according to one related art. One end portion of a nitrogen supply pipe 25 is located at a portion of the periphery of an opening 17 of the ambient gas substitution apparatus 16 of this related art, and the other end portion of the nitrogen supply pipe 25 is connected to a nitrogen gas line through a gas supply valve 26. One end portion of an exhaust pipe 27 is located on a side of the periphery of the opening 17 which is opposite to one end portion of the nitrogen supply pipe 25, and the other end portion of the exhaust pipe 27 is connected to an exhaust duct through an exhaust valve 28.

When an elevator 19 is stopped immediately before a bottom plate 14 closes the opening 17 to form a sealed space together with a housing 15, as described above, in order to substitute the ambient gas in the portable sealed container 11 for nitrogen, the gas supply valve 26 and the exhaust valve 28 are opened. As a result, nitrogen is supplied from the nitrogen gas line into the portable sealed container 11 through the nitrogen supply pipe 25. The ambient gas in the portable sealed container 11 is pushed to the outside through the exhaust pipe 27, and the oxygen concentration of the ambient gas in the portable sealed container 11 is accordingly decreased. Thereafter, the gas supply valve 26 and the exhaust valve 28 are closed.

As shown in FIG. 2, in the portable sealed container 11 and ambient gas substitution apparatus 16 of these related arts, a nitrogen flow 29 in the portable sealed container 11 is a turbulence, and the ambient gas that fills the portable sealed container 11 and nitrogen supplied from the nitrogen supply pipe 25 are mixed. Therefore, the ambient gas that fills the portable sealed container 11 is not efficiently discharged through the exhaust pipe 27. To substitute the ambient gas in the portable sealed container 11 with nitrogen takes a long period of time, and it is difficult to completely substitute the ambient gas in the portable sealed container 11 with nitrogen.

If substitution of the ambient gas in the portable sealed container 11 takes a long period of time, not only is the semiconductor device manufacturing time prolonged, but also the amount of nitrogen to be supplied from the nitrogen supply pipe 25 is increased, resulting in a high semiconductor device manufacturing cost. If the ambient gas in the portable sealed container 11 cannot be completely substituted with nitrogen, contamination caused by adsorption of organic substances or the like and growth of the native oxide during conveyance are likely to occur, and the quality, e.g., electrical characteristics, of the semiconductor devices is decreased to decrease the yield. This also increases the semiconductor device manufacturing cost.

SUMMARY OF THE INVENTION

It is, therefore, an object of the present invention to provide a sealed container and a sealed container ambient gas substitution apparatus and method which can completely substitute the ambient gas within a very short period of time.

A sealed container comprising a housing portion having first and second opposing inner surfaces, and a base portion for holding a plate-like body to be perpendicular to the first and second inner surfaces and for fitting with the housing portion to form a sealed space, is characterized by further comprising first and second wall portions respectively spreading along the first and second inner surfaces, and a plurality of vent pores formed in the first and second wall portions and distributed along the first and second inner surfaces.

In this manner, in the sealed container, the first and second wall portions respectively spread along the first and second opposing inner surfaces of the housing portion, and the plurality of vent pores that are distributed along the first and second inner surfaces are formed in the first and second wall portions. Then, an ambient gas is supplied to a space between the first inner surface and the first wall portion. When the ambient gas is discharged from the space between the second inner surface and the second wall portion, a laminar flow of the ambient gas directed from the first inner surface toward the second inner surface is formed to be parallel to the plate-like body held by the base portion.

Hence, the ambient gas that fills the sealed container will not be easily mixed with the newly supplied ambient gas but is pushed by it to be discharged efficiently. At the same time, the newly supplied ambient gas spreads well throughout the sealed container within a very short period of time. Therefore, substitution of the ambient gas filling the sealed container with the newly supplied ambient gas is not easily interfered with, and the ambient gas in the sealed container can be completely substituted within a very short period of time.

The sealed container is characterized in that, in the sealed container, the base portion is formed with third and fourth wall portions that respectively oppose the first and second wall portions while the base portion is fitted with the housing portion.

In this manner, in the sealed container, the base portion is formed with the third and fourth wall portions that respectively oppose the first and second wall portions of the housing portion when the base portion is fitted with the housing portion. Therefore, even if the base portion and the housing portion are separated from each other for the purpose of ambient gas supply and discharge, the space between the first wall portion and the base portion, and the space between the second wall portion and the base portion can be respectively closed with the third and fourth wall portions. The ambient gas is supplied to only the space between the first inner surface and the first wall portion. The ambient gas can be discharged only from the space between the second inner surface and the second wall portion.

Hence, the ambient gas that fills the sealed container will not be easily mixed with the newly supplied ambient gas but is pushed by it to be discharged further efficiently. At the same time, the newly supplied ambient gas spreads well throughout the sealed container within a further very short period of time. Therefore, substitution of the ambient gas filling the sealed container with the newly supplied ambient gas is not easily interfered with, and the ambient gas in the sealed container can be completely substituted within a further very short period of time.

A sealed container ambient gas substitution apparatus, for substituting an ambient gas in a sealed container in which a base portion and a housing portion are fitted with each other to form a sealed space, is characterized by comprising an opening through which the base portion can pass and which is covered by the housing portion, and a gas supply port and a vacuum exhaust port opposing the opening.

In this manner, since the sealed container ambient gas substitution apparatus according to claim 3 comprises the opening through which the base portion of the sealed container can pass and which is covered by the housing portion, the base portion and the housing portion can be separated from each other through the opening. In addition, since the apparatus has the gas supply port and the vacuum exhaust port opposing the opening, the ambient gas can be supplied after the sealed container is evacuated.

Hence, the ambient gas that fills the sealed container will not be mixed with the ambient gas supplied through the gas supply port at all, but the ambient gas supplied through the gas supply port spreads well throughout the sealed container within a very short period of time. Accordingly, substitution of the ambient gas filling the sealed container with the ambient gas supplied through the gas supply port is not interfered with at all, and the ambient gas in the sealed container can be completely substituted within a very short period of time.

A sealed container ambient gas substitution method, of substituting an ambient gas in a sealed container in which a plate-like body is held in a sealed space formed by fitting a base portion and a housing portion with each other, is characterized by comprising forming a flow of the ambient gas parallel to the plate-like body while the base portion and the housing portion are not fitted with each other.

In this manner, in the sealed container ambient gas substitution method according to claim 4, the flow of the ambient gas parallel to the plate-like body held in the sealed container is formed while the base portion and housing portion of the sealed container are not fitted with each other. Therefore, the new ambient gas is supplied into the sealed container from one side of the plate-like body, and the ambient gas filling the sealed container is discharged from the other side of the plate-like body to the outside of the sealed container.

In addition, since the flow of the ambient gas is parallel to the plate-like body, a laminar flow of the ambient gas is formed, so that the ambient gas that fills the sealed container will not be easily mixed with the newly supplied ambient gas but is pushed by it to be discharged efficiently to the outside of the sealed container. At the same time, the newly supplied ambient gas spreads well throughout the sealed container within a very short period of time. Therefore, substitution of the ambient gas filling the sealed container with the newly supplied ambient gas is not easily interfered with, and the ambient gas in the sealed container can be completely substituted within a very short period of time.

A sealed container ambient gas substitution method, of substituting an ambient gas in a sealed container is characterized by comprising supplying the ambient gas into the sealed container after the sealed container is evacuated.

In this manner, in the sealed container ambient gas substitution method, the sealed container is evacuated, and thereafter the ambient gas is supplied into the sealed container. Hence, the ambient gas that fills the sealed container will not be mixed with the newly supplied ambient gas at all, but the newly supplied ambient gas spreads well throughout the sealed container within a very short period of time. Accordingly, substitution of the ambient gas filling the sealed container for the newly supplied ambient gas is not interfered with at all, and the ambient gas in the sealed container can be completely substituted within a very short period of time.

DETAILED DESCRIPTION OF THE PREFERRED EMBODIMENTS

Figure 1:
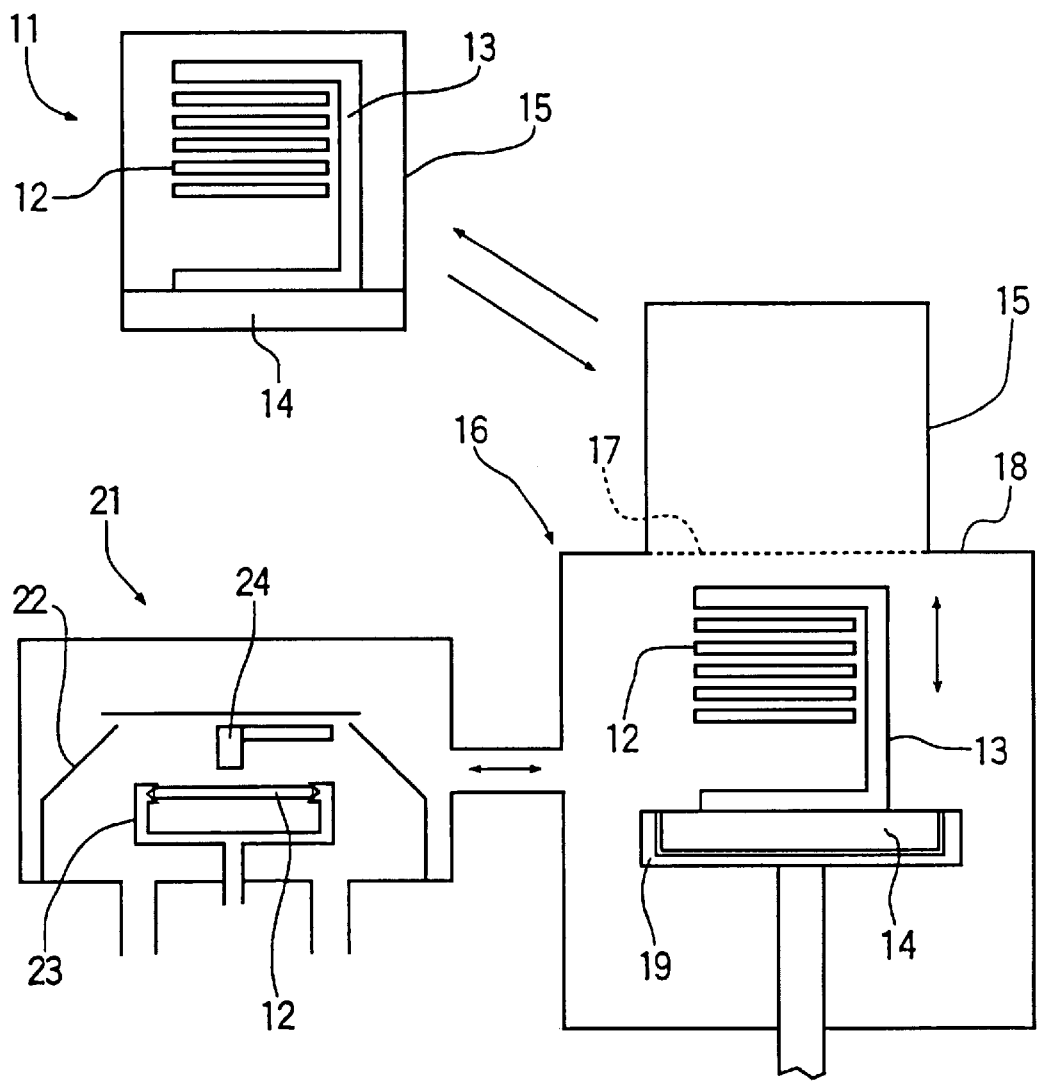
FIG. 1 is a side sectional view of a semiconductor wafer portable sealed container, a semiconductor wafer cleaning unit and a portable sealed container ambient gas substitution apparatus mounted on this cleaning unit, to which the present invention can be applied.

The first and second embodiments, in which the present invention is applied to the portable sealed container 11 for the semiconductor wafers 12, the ambient gas substitution apparatus 16 for the portable sealed container 11 mounted on the cleaning unit 21 for the semiconductor wafers 12 and the method of substituting the ambient gas for the portable sealed container 11, which are shown in FIG. 1, will be described with reference to FIGS. 3 to 6.

Figure 3:
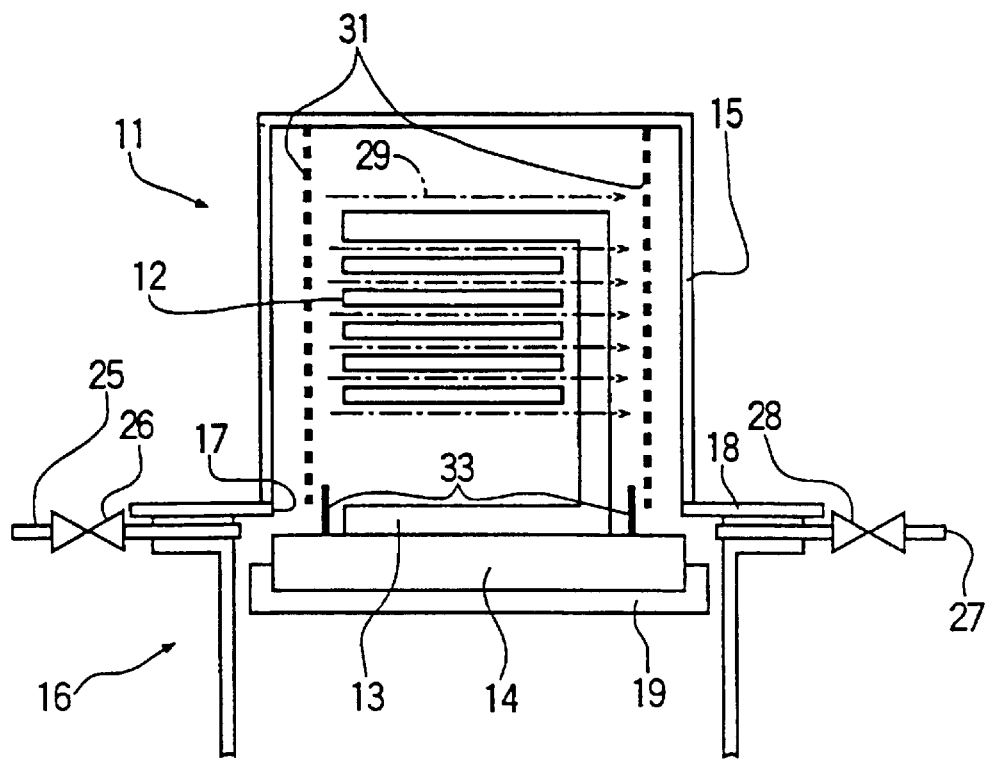
FIG. 3 is a side sectional view of the main part of the first embodiment of the present invention.
Figure 4:
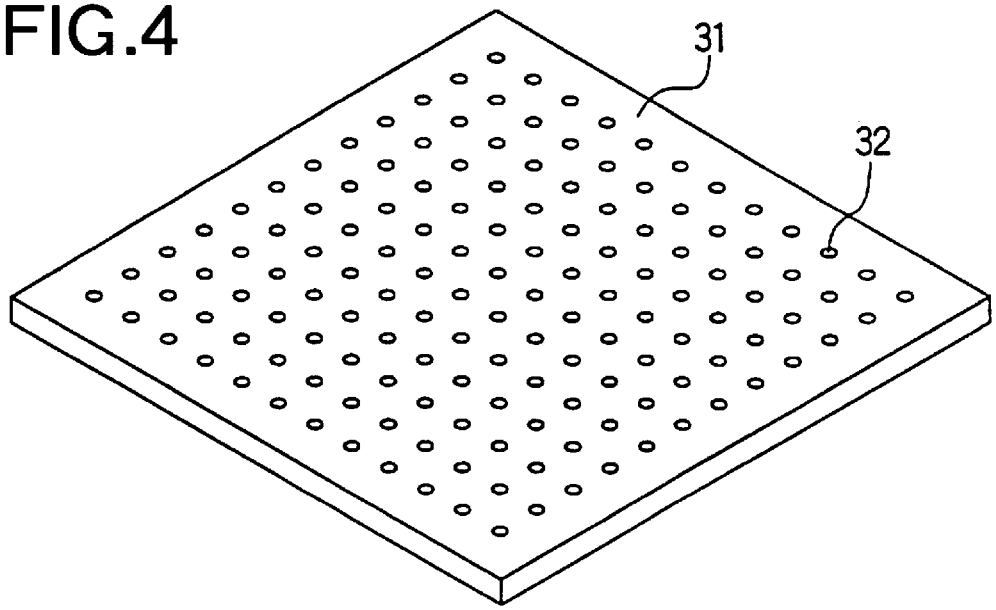
FIG. 4 is a perspective view of a diffusion plate used in the first embodiment.

FIGS. 3 and 4 show the first embodiment in which the present invention is applied to a portable sealed container 11. As shown in FIG. 3, in the portable sealed container 11 of the first embodiment, a pair of diffusion plates 31 spreading along the two opposing inner side surfaces of a housing 15 are attached to the housing 15. As shown in FIG. 4, a large number of pores 32 are formed in each diffusion plate 31.

Blocking plates 33, which oppose the corresponding diffusion plates 31 when a bottom plate 14 and the housing 15 are fitted with each other and which block the gaps between the bottom plate 14 and diffusion plates 31 when the bottom plate 14 and the housing 15 are not fitted with each other, are arranged on the bottom plate 14. Except for this, the portable sealed container 11 of the first embodiment has substantially the same arrangement as that of the portable sealed container 11 of the related art shown in FIG. 2.

After the semiconductor wafers 12 are cleaned by the cleaning unit 21 shown in FIG. 1, the ambient gas in the portable sealed container 11 of the first embodiment is substituted with nitrogen. For this purpose, while an elevator 19 is stopped immediately before the bottom plate 14 of the portable sealed container 11 closes an opening 17 of the ambient gas substitution apparatus 16 to form a sealed space together with the housing 15 as shown in FIG. 3, a gas supply valve 26 and an exhaust valve 28 are opened.

As a result, nitrogen is supplied from a nitrogen supply pipe 25. Since nitrogen is blocked by the blocking plates 33, it is not diffused in the housing 15 immediately, but flows toward the upper surface of the housing 15 mainly through a space between the inner side surface of the housing 15 and the diffusion plate 31 on the nitrogen supply pipe 25 side. Thereafter, nitrogen flowing out from the pores 32 of the diffusion plate 31 flows toward the diffusion plate 31 on the exhaust pipe 27 side, passes through the pores 32 of this diffusion plate 31, flows toward the exhaust pipe 27 through a space between the inner surface of the housing 15 and this diffusion plate 31, and is discharged through the exhaust pipe 27.

As shown in FIG. 3, in the portable sealed container 11 of the first embodiment, a nitrogen flow 29 in the portable sealed container 11 forms a laminar flow flowing from the diffusion plate 31 on the nitrogen supply pipe 25 side toward the diffusion plate 31 on the exhaust pipe 27 side, and nitrogen flows in parallel to semiconductor wafers 12 in a cassette 13.

Hence, the ambient gas that fills the portable sealed container 11 will not be easily mixed with nitrogen but is pushed by it from the diffusion plate 31 on the nitrogen supply pipe 25 side toward the diffusion plate 31 on the exhaust pipe 27 side and is efficiently discharged through the exhaust pipe 27. At the same time, nitrogen spreads well throughout the portable sealed container 11 within a very short period of time.

Figure 2:
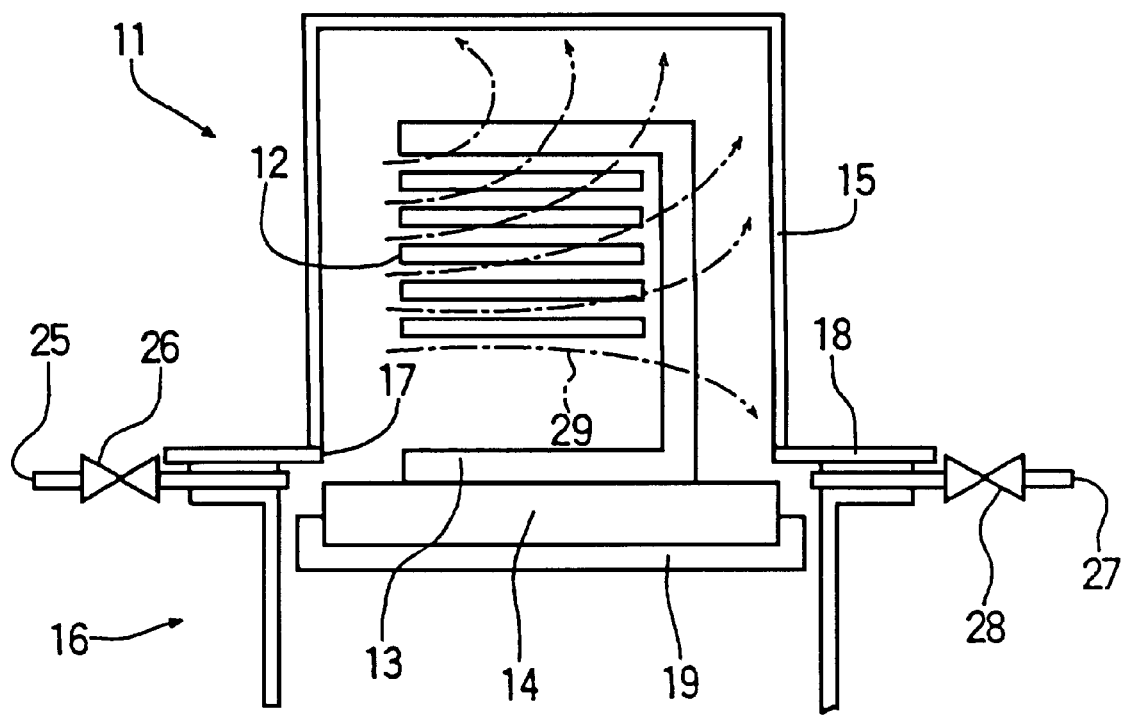
FIG. 2 is a side sectional view of the main part of one related art of the present invention.
Figure 5:
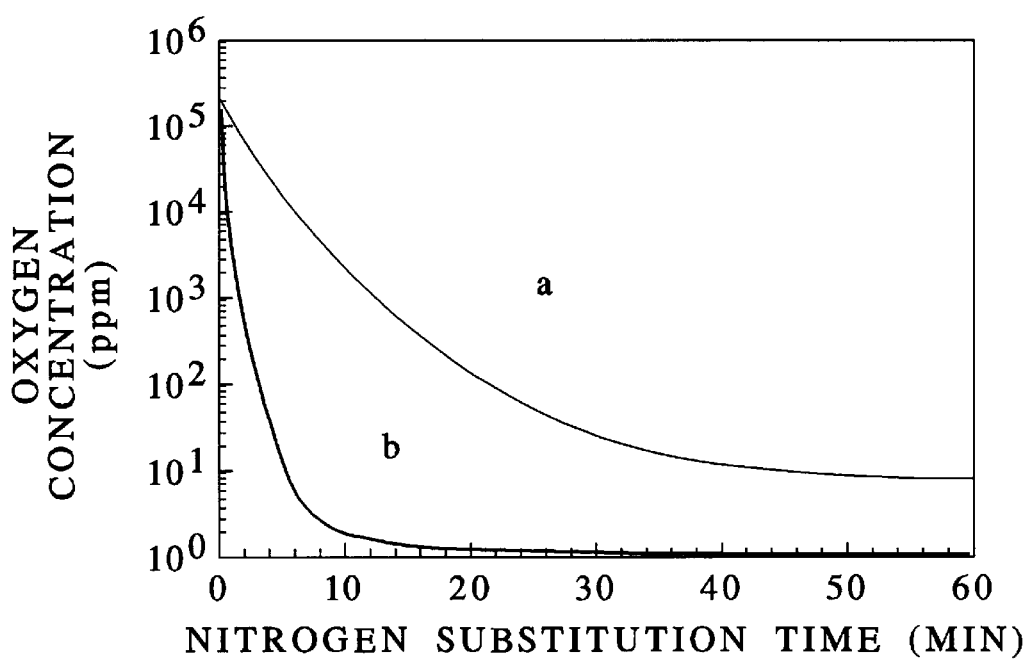
FIG. 5 is a graph showing the relationship between nitrogen substitution time and the oxygen concentration, in which a and b respectively indicate the relationships in the related art and the first embodiment.

FIG. 5 is a graph showing the relationships between nitrogen substitution time after the gas supply valve 26 and the exhaust valve 28 are opened and the oxygen concentration in the portable sealed container 11, and shows a relationship a in the portable sealed container 11 of the related art shown in FIG. 2 and a relationship b in the portable sealed container 11 of the first embodiment shown in FIG. 3. From FIG. 5, it is apparent that the ambient gas in the portable sealed container 11 of the first embodiment is completely substituted with nitrogen within a very short period of time.

Figure 6:
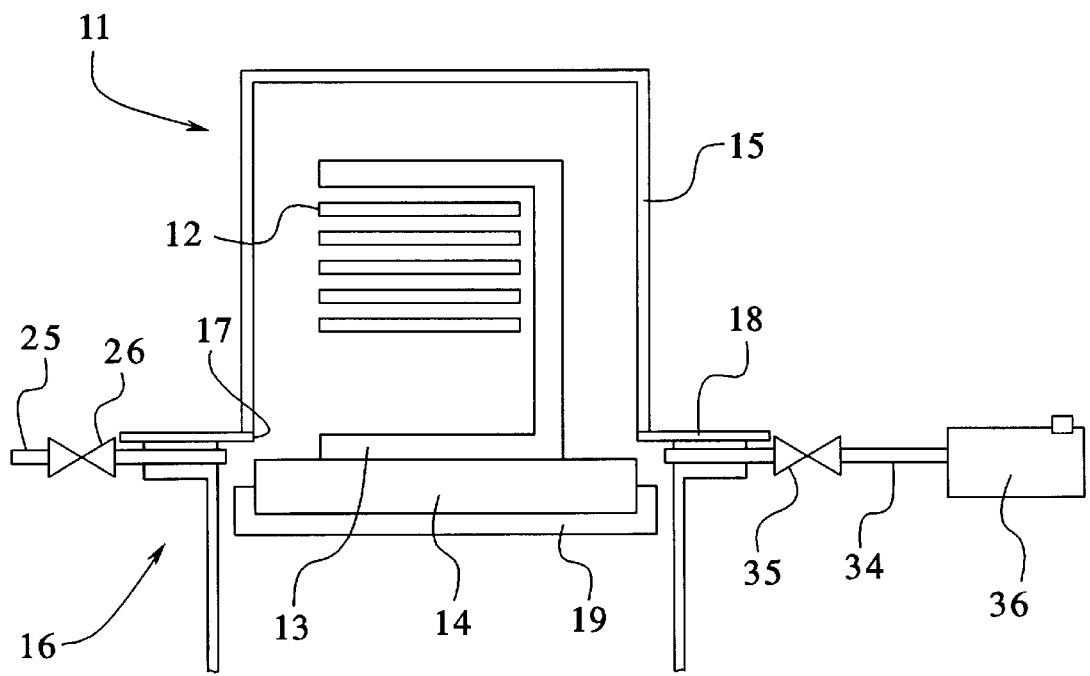
FIG. 6 is a side sectional view of the main part of the second embodiment of the present invention.

FIG. 6 shows the second embodiment in which the present invention is applied to an ambient gas substitution apparatus 16. The ambient gas substitution apparatus 16 of the second embodiment has substantially the same arrangement as the ambient gas substitution apparatus 16 of the related art shown in FIG. 2 except that a vacuum exhaust pipe 34 and a vacuum exhaust valve 35 are arranged in place of the exhaust pipe 27 and exhaust valve 28 and that the vacuum exhaust pipe 34 is connected to a vacuum pump 36 through the vacuum exhaust valve 35.

After the semiconductor wafers 12 are cleaned by the cleaning unit 21 shown in FIG. 1, the ambient gas in the portable sealed container 11 is substituted with nitrogen with the ambient gas substitution apparatus 16 of the second embodiment. For this purpose, while an elevator 19 is stopped immediately before a bottom plate 14 of the portable sealed container 11 closes an opening 17 of the ambient gas substitution apparatus 16 to form a sealed space together with a housing 15 as shown in FIG. 6, the vacuum exhaust valve 35 is opened to evacuate the portable sealed container 11 with the vacuum pump 36 and the vacuum exhaust pipe 34, and thereafter the vacuum exhaust valve 35 is closed and a gas supply valve 26 is opened.

As a result, the ambient gas that had filled the portable sealed container 11 does not get mixed with the nitrogen at all, and the nitrogen spreads throughout the portable sealed container 11. Accordingly, the ambient gas in the portable sealed container 11 is completely substituted with nitrogen within a very short period of time by only supplying a small amount of nitrogen.

As described above, with the portable sealed container 11 of the first embodiment and the ambient gas substitution apparatus 16 of the second embodiment, substitution of the ambient gas in the portable sealed container 11 takes only a short period of time. Therefore, not only is the semiconductor device manufacturing time shortened, but also the amount of nitrogen to be supplied from the nitrogen supply pipe 25 is decreased, decreasing the semiconductor device manufacturing cost.

Since the ambient gas in the portable sealed container 11 can be completely substituted with nitrogen, contamination caused by adsorption of organic substances or the like and growth of the native oxide during conveyance are unlikely to occur, and the quality, e.g., electrical characteristics, of the semiconductor devices is improved to increase the yield. This also decreases the semiconductor device manufacturing cost.

In FIG. 3, the portable sealed container 11 of the first embodiment is used together with the ambient gas substitution apparatus 16 of the related art, and in FIG. 6, the ambient gas substitution apparatus 16 of the second embodiment is used together with the portable sealed container 11 of the related art. However, the portable sealed container 11 of the first embodiment and the ambient gas substitution apparatus 16 of the second embodiment may be used simultaneously.

In the first and second embodiments, the ambient gas in the portable sealed container 11 is substituted with nitrogen. However, this ambient gas can be substituted with an inert gas other than nitrogen. The present invention can similarly be applied to substitution for an ambient gas other than an inert gas.

In the first and second embodiments, the present invention is applied to the portable sealed container 11 for the semiconductor wafers 12, the ambient gas substitution apparatus 16 for the portable sealed container 11 mounted on the cleaning unit 21 for the semiconductor wafers 12 and the ambient gas substitution method for the portable sealed container 11. The present invention can also be applied to a portable sealed container for plate-like bodies other than the semiconductor wafers 12, a non-portable sealed container and an ambient gas substitution apparatus which is used together with an apparatus other than a semiconductor manufacturing apparatus.

What is claimed is:

1. A sealed container, comprising:
    a housing portion having first and second opposing inner surfaces,
    a base portion for holding a plate-like body to be perpendicular to said first and second inner surfaces and for fitting with said housing portion to form a sealed space,
    a gas supply opening in said housing portion at said first opposing inner surface;
    a gas exhaust opening in said housing portion at said second opposing inner surface;
    first and second wall portions respectively along said first and second inner surfaces, said first wall portion being spaced from said first opposing inner surface to define a first gas flow passage between said first wall portion and said first opposing inner surface in communication with said gas supply opening, said second wall portion being spaced from said second opposing inner surface to define a second gas flow passage between said second wall portion and said second opposing inner surface in communication with said gas exhaust opening; and
    said first and second wall portions defining a plurality of vent pores formed in said first and second wall portions and distributed along said first and second inner surfaces to provide a plurality of gas flow paths between said first and second gas flow passages through said vent pores.

2. A sealed container according to claim 1, further comprising:
    third and fourth wall portions on said base portion that respectively oppose said gas supply opening and said gas exhaust opening while said base portion is fitted with said housing portion so as to deflect gas flowing through said gas supply opening and said gas exhaust opening through said said first and second gas flow passages.

* * * * *